(12) United States Patent
Chang et al.

(10) Patent No.: US 10,535,610 B2
(45) Date of Patent: Jan. 14, 2020

(54) SEMICONDUCTOR STRUCTURE

(71) Applicants: UNITED MICROELECTRONICS CORP., Hsin-Chu (TW); Fujian Jinhua Integrated Circuit Co., Ltd., Quanzhou, Fujian Province (CN)

(72) Inventors: Feng-Yi Chang, Tainan (TW); Fu-Che Lee, Taichung (TW); Yi-Wang Zhan, Taichung (TW); Chia-Liang Liao, Yunlin County (TW); Yu-Cheng Tung, Kaohsiung (TW); Chien-Hao Chen, Tainan (TW); Chia-Hung Wang, Taichung (TW)

(73) Assignees: UNITED MICROELECTRONICS CORP., Hsin-Chu (TW); Fujian Jinhua Integrated Circuit Co., Ltd., Quanzhou, Fujian Province (CN)

( * ) Notice: Subject to any disclaimer, the term of this patent is extended or adjusted under 35 U.S.C. 154(b) by 47 days.

(21) Appl. No.: 16/003,090

(22) Filed: Jun. 7, 2018

(65) Prior Publication Data
US 2019/0035743 A1 Jan. 31, 2019

(30) Foreign Application Priority Data
Jul. 28, 2017 (CN) .......................... 2017 1 0628535

(51) Int. Cl.
*H01L 23/544* (2006.01)
*H01L 27/108* (2006.01)
*H01L 21/311* (2006.01)

(52) U.S. Cl.
CPC ...... *H01L 23/544* (2013.01); *H01L 27/10808* (2013.01); *H01L 27/10852* (2013.01); *H01L 21/31116* (2013.01); *H01L 21/31144* (2013.01); *H01L 2223/5446* (2013.01); *H01L 2223/54426* (2013.01)

(58) Field of Classification Search
CPC ............ H01L 23/544; H01L 27/10808; H01L 27/10852
See application file for complete search history.

(56) References Cited

U.S. PATENT DOCUMENTS

| 5,172,190 | A | * | 12/1992 | Kaiser | .................. G03F 9/7076 |
| | | | | | 250/548 |
| 6,137,578 | A | | 10/2000 | Ausschnitt | |
| 6,172,409 | B1 | * | 1/2001 | Zhou | ...................... G03F 7/708 |
| | | | | | 257/620 |
| 6,985,618 | B2 | | 1/2006 | Adel | |
| 7,180,189 | B2 | | 2/2007 | Bowes | |
| 2009/0305505 | A1 | | 12/2009 | Park | |

* cited by examiner

*Primary Examiner* — Marc Anthony Armand
(74) *Attorney, Agent, or Firm* — Winston Hsu

(57) ABSTRACT

A semiconductor structure is disclosed. The semiconductor structure includes a substrate having a scribe line region. A material layer is formed on the scribe line region and has a rectangular region defined therein. The rectangular region has a pair of first edges parallel with a widthwise direction of the scribe line region and a pair of second edges parallel with a lengthwise direction of the scribe line region. A pair of first alignment features is formed in the material layer along the first edges, and a pair of second alignment features is formed in the material layer along the second edges. The space between the pair of first alignment features is larger than a space between the pair of the second alignment features.

19 Claims, 14 Drawing Sheets

SEMICONDUCTOR STRUCTURE

BACKGROUND OF THE INVENTION

1. Field of the Invention

This invention generally relates to a semiconductor structure and method for forming the same. More particularly, this invention relates to a semiconductor structure that may be used as an alignment mark and method of forming the same.

2. Description of the Prior Art

A dynamic random access memory (DRAM) is one kind of volatile memory. A DRAM usually includes an array region including a plurality of memory cells and a peripheral region including control circuits. Typically, a memory cell includes one transistor and one capacitor electrically coupled to the transistor, which is known as a 1T1C cell. A digital data is stored in a memory cell by controlling the transistor to charge or discharge the capacitor. The control circuits in the peripheral region may address each of the memory cells in the array region by plural columns of word lines and plural rows of bit lines traversing the array region and electrically connected to each of the memory cells to perform reading, writing or erasing data.

In advanced semiconductor manufacturing, the memory cells have been miniaturized for higher integrity by adopting three-dimensional structures. For example, memory cells having capacitors (also known as crown-type capacitors) formed vertically stacked on the transistors have been widely adopted. The crown-type capacitors have the electrodes extending upwardly from the substrate and may occupy a much smaller areas of the substrate. Furthermore, the capacitances of the capacitors may be increased by simply increasing the height of the capacitors. The process of fabricating the crown-type capacitors may include depositing a sacrificial layer on the substrate and forming a plurality of openings in predetermined regions of the sacrificial layer. Subsequently, each of the openings may be conformally covered by a bottom conductive layer. The bottom conductive layer outside the openings may be removed and the remaining portions of the bottom conductive layer within the openings become plural hollow-pillar shaped (crown-shaped) bottom electrodes. Afterward, the sacrificial layer may be removed and the hollow-pillar shaped bottom electrodes are therefore exposed, standing upwardly on the substrate and having the inner surfaces and outer surfaces exposed. Following, a capacitor dielectric layer and a top conductive layer (functioning as the top electrode) are successively formed and conformally covering the bottom electrodes to form capacitors.

The height of the capacitors may adversely result in collapse problems during manufacturing. To prevent the collapse problem, the sacrificial layer may comprise at least a supporting layer that would not be removed when removing the sacrificial layer and may help to support the bottom electrodes during the subsequent processes. However, an additional patterning process such as a photolithography-etching process has to be performed when implanting the supporting layer to form openings in the supporting layer to provide accesses to remove the sacrificial layer. To make sure that the openings would be formed precisely in the desired regions of the supporting layer, alignment marks for evaluating the alignment accuracy of the aforesaid patterning process are necessary.

Please refer to FIG. 1, which illustrates the top view of a conventional alignment mark 250 and the arrangement of the alignment mark 250 on a substrate 200. The substrate 200 may have a plurality of chip regions 220 arranged into an array of columns along the Y direction and rows along the X direction. The chip regions 220 are separated from each other by the scribe line regions 240 extending along the X direction or Y direction. A plurality of alignment marks 250 may be formed in predetermined regions in the scribe line regions 240. As shown in the right portion of FIG. 1, the alignment mark 250 usually comprises gratings of very narrow trenches 252 formed in the sacrificial layer. The length of the trenches 252 may be several micrometers, such as 8 micrometers, while the width of the trenches 252 may be hundreds of nanometers, such as 200 nanometers. The dimensions of the trenches 252 of the alignment mark 250 are so much larger with respective to other openings in the sacrificial layer for forming the capacitors that the trenches 252 may be under-etched due to the etching loading effect, resulting in pattern deformation of the alignment mark 250. Furthermore, the bottom conductive layer may also fill into the trenches 252 and conformally cover the trenches 252. After removing the sacrificial layer, the bottom conductive layer in the trenches 252 is exposed and becomes giant hollow-plate structures standing upwardly on the substrate which may collapse easily and become defect sources. Therefore, there is still a need to provide a semiconductor structure that may be used as an alignment mark in the manufacturing process of the crown-type capacitors.

SUMMARY OF THE INVENTION

It is one objective of the present invention to provide a semiconductor structure that may be used as an alignment mark in the manufacturing process of the crown-type capacitors of a DRAM device without concerning the collapse problem.

According to one embodiment of the present invention, a semiconductor structure is disclosed. The semiconductor structure includes a substrate having a scribe line region, a material layer formed on the scribe line region and having a rectangular region defined therein. The rectangular region has a pair of first edges parallel with a widthwise direction of the scribe line region and a pair of second edges parallel with a lengthwise direction of the scribe line region. The semiconductor structure also includes a pair of first alignment features formed in the material layer along the first edges, and a pair of second alignment features formed in the material layer along the second edges. A space between the pair of first alignment features is larger than a space between the pair of the second alignment features.

According to one embodiment of the present invention, each of the first alignment features and the second alignment features comprise at least a feature pattern that has a bar-shaped top view.

According to one embodiment of the present invention, the feature pattern is an array pattern made of a plurality of openings.

According to one embodiment of the present invention, the openings penetrate through the whole thickness of the material layer. A plurality of hollow-pillar structures may be conformally formed in the openings.

According to one embodiment of the present invention, the material layer comprises a top supporting layer, a bottom supporting layer and a sacrificial layer sandwiched between the top supporting layer and the bottom supporting layer. The sacrificial layer partially fills the space between the top supporting layer and the bottom supporting layer and becomes a third alignment feature. The other space between the top supporting layer and the bottom supporting layer not filled by the sacrificial layer is a gap.

According to one embodiment of the present invention, the third alignment feature overlaps the first alignment features. The third alignment feature does not overlap the second alignment features from the top view.

According to one embodiment of the present invention, the hollow-pillar structures in the middle portion of the first alignment features are surrounded by the sacrificial layer, the hollow-pillar structures in the two ends of the first alignment features are surrounded by the gap.

According to one embodiment of the present invention, all of the hollow-pillar structures of the second alignment features are surrounded by the gap.

The alignment mark provided by the present invention that the alignment mark is made of feature patterns that are array patterns of openings. Therefore, densely arranged hollow-pillar structures would be formed instead of the hollow-plate structures that would be formed in the conventional alignment mark, and the collapse problem may be prevented. Furthermore, by surrounding some of the hollow-pillar structures with the sacrificial layer, the three-dimensional structure of the alignment mark may be more securely supported.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings.

DETAILED DESCRIPTION

The present invention pertains to a semiconductor structure that may be utilized as an alignment mark when fabricating a semiconductor device.

Figure 1:
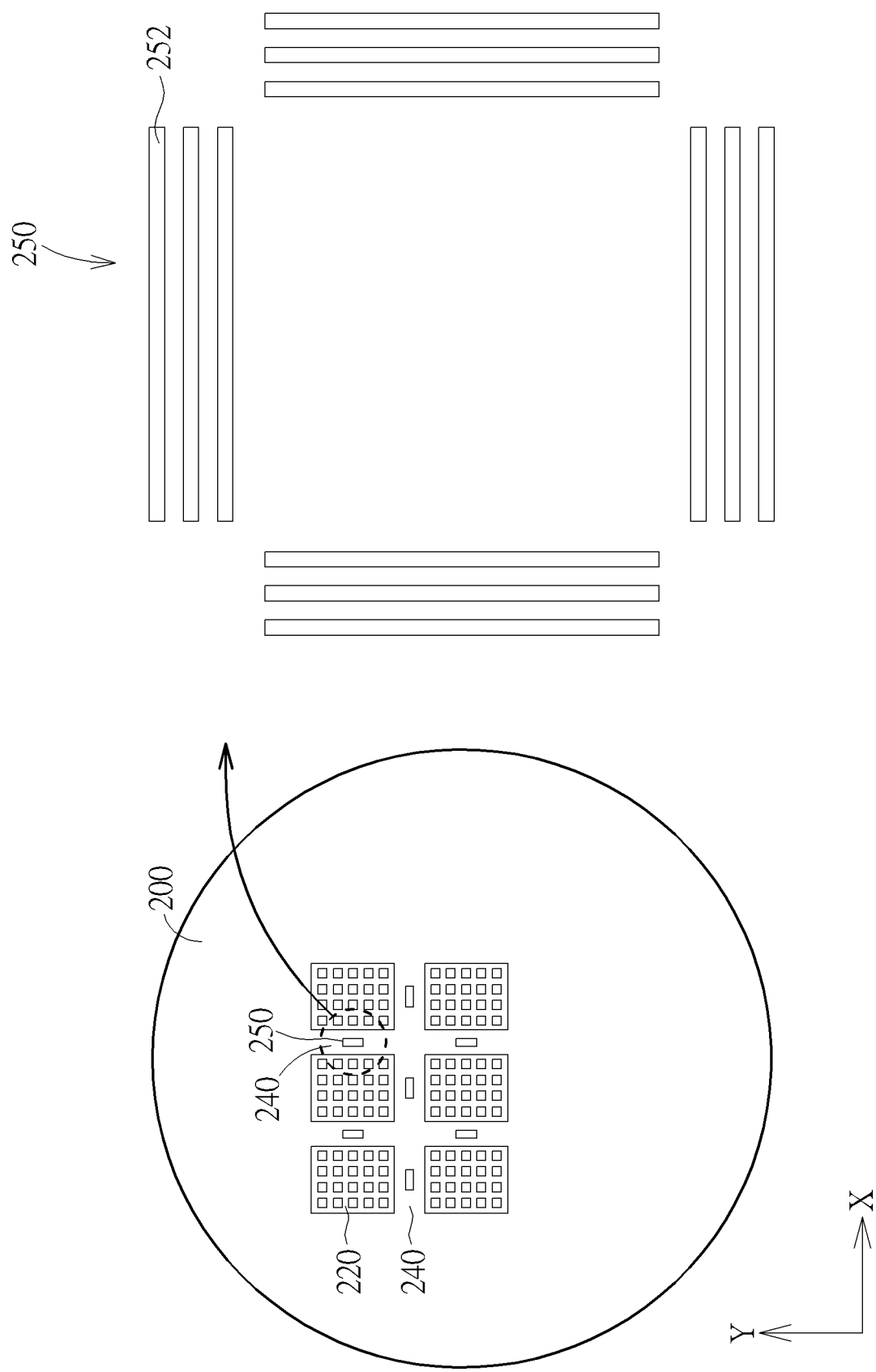
FIG. 1 is a schematic diagram illustrating a conventional alignment mark and the position of the alignment mark on a substrate.
Figure 2:
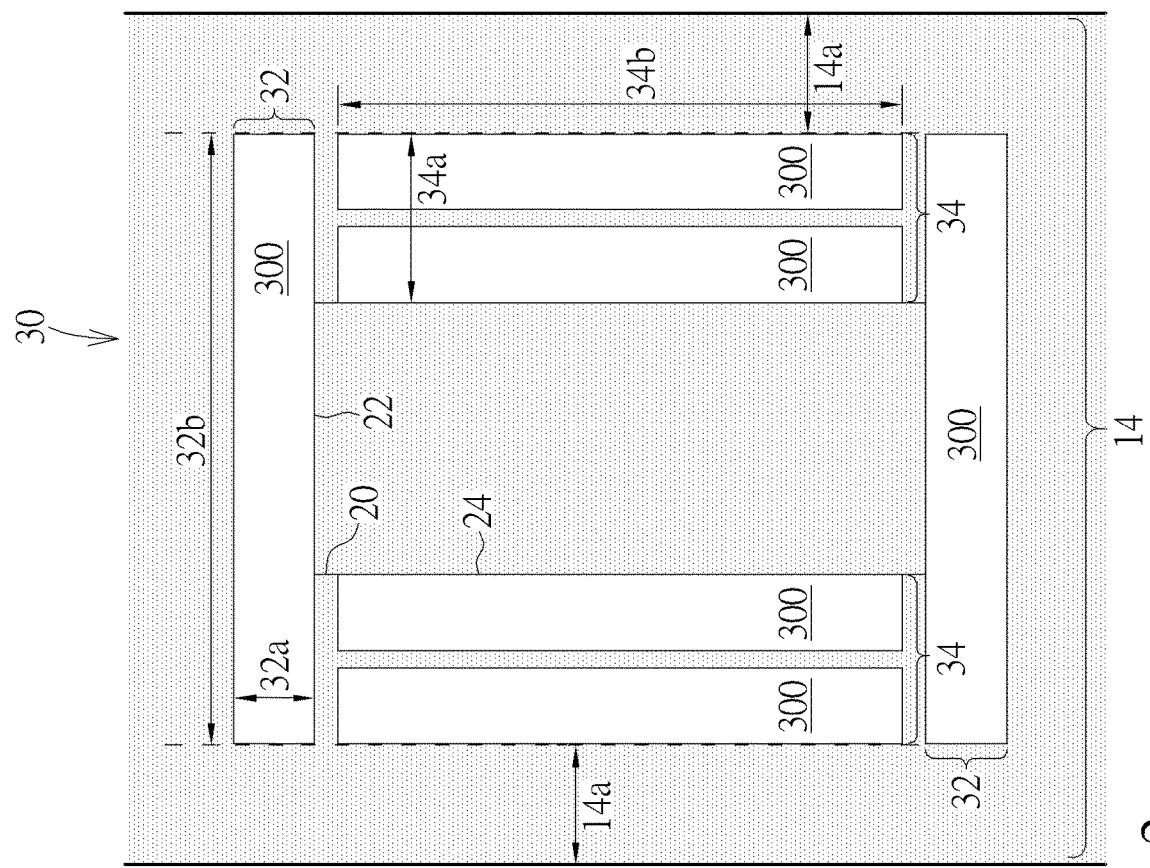
FIG. 2 is a schematic diagram illustrating a top view of the semiconductor structure and the position of the semiconductor structure on a substrate according to an embodiment of the present invention.
Figure 2:
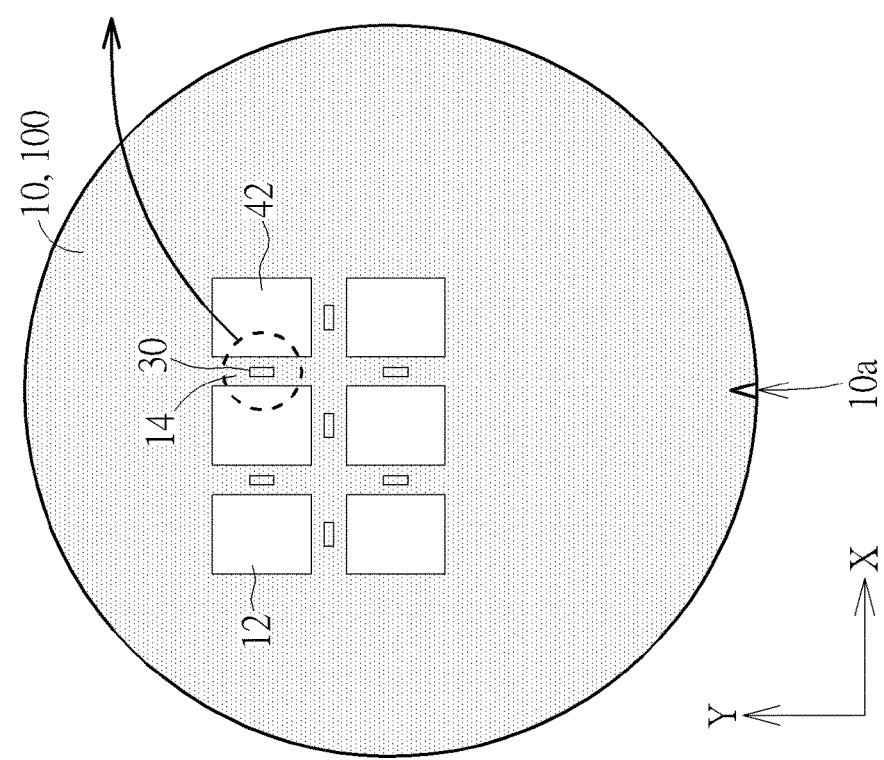

Please refer to FIG. 2, which illustrates a top view of the semiconductor structure 30 and the arrangement of the semiconductor structure 30 on a substrate 10 according to an embodiment of the present invention.

As shown in the left portion of FIG. 2, the substrate 10 such as a silicon wafer may have a plurality of chip regions 12 formed thereon that are arranged into an array of columns along the Y direction and rows along the X direction and are separated from each other by the scribe line regions 14 extending along the X direction and Y direction. For the sake of illustration, in the following description, the Y direction is defined as the direction passing through the center of the substrate 10 and a notch 10a that is used to designate the orientation of the substrate 10, and the X direction is the direction perpendicular to the Y direction. According to various embodiments, the Y direction may refer to a direction having a central angle with the direction passing through the center and the notch 10a. For example, the Y direction may be a direction having a 45-degree central angle with the direction passing through the center and the notch 10a.

The substrate 10 may be a substrate used for fabrication DRAM devices and may have transistors, word-lines, bit-lines and interconnecting structures such as contact plugs formed therein. These structures are not shown in the drawings for the sake of simplicity. According to an embodiment, a material layer 100 is formed on the substrate 10 in a blanket manner and completely covers the chip regions 12 and the scribe line regions 14. The material layer 100 on the chip regions 12 may be patterned to form a plurality openings (see FIG. 3C for example) for forming the crown-type capacitors of the DRAM devices. The material layer 100 on the scribe line regions 14 may also be patterned to form the semiconductor structures 30 that may function as the alignment marks in subsequent process of forming the crown-type capacitors of the DRAM devices. According to an embodiment, plural semiconductor structures 30 are formed in the material layer 100 on the scribe line regions 14 along the X direction and the Y direction.

As shown in the right portion of FIG. 2, according to an embodiment, the semiconductor structure 30 includes a pair of first alignment features 32 and a pair of second alignment features 34 arranged on the four edges of a rectangular region 20. More particularly, the rectangular region 20 has a pair of first edges 22 parallel with the widthwise direction of the scribe line region 14 and a pair of second edges 24 parallel with the lengthwise direction of the scribe line region 14. The first alignment features 32 are arranged along the first edges 22 of the rectangular region 20. The second alignment features 34 are arranged at the other two sides of the rectangular region 20 along the second edges 24. The edges of the first alignment features 32 and the second alignment features 34 that are overlapping with the first edges 22 and the second edges 24 are referred to as the "inner edges", and the edges parallel with and opposite to the inner edges are refer to as the "outer edges". According to an embodiment, the first edges 22 are the shorter sides of the rectangular region 20, and the second edges 24 are the longer sides of the rectangular region 20. The distance between the pair of the first alignment features 32 is larger than the distance between the pair of the second alignment features 34.

Please still refer to the right portion of FIG. 2. The first alignment feature 32 may have a length 32b larger than the length of the first edge 22 and the second alignment feature 34 may have a length 34b smaller than the length of the second edge 24. The two distal ends of the first alignment feature 32 are respectively aligned with the outer edges of the second alignment feature 34, therefore the second alignment features 34 are completely within the regions between the two first alignment features 32. The first alignment feature 32 and the second alignment feature 34 may respectively include at least a feature pattern 300. The feature pattern 300 has a bar-shaped top view, and the widths of the first alignment feature 32 and the second alignment feature 34 are the overall widths of the feature patterns 300 and the spaces between the feature patterns 300 thereof. According to an embodiment, the numbers of the feature patterns 300 of the first alignment feature 32 and the second alignment feature 34 may be different, and therefore the first alignment feature 32 and the second alignment feature 34 may have different widths. According to an embodiment, the second alignment feature 34 may have more feature patterns 300 than the first alignment feature 32 does, and the second alignment feature 34 may have a width 34a larger than a width 32a of the first alignment feature 32. For example, as shown in the right portion of FIG. 2, each of the first alignment features 32 may have one feature pattern 300, and each of the second alignment features 34 may have two feature patterns 300.

Figure 3A:
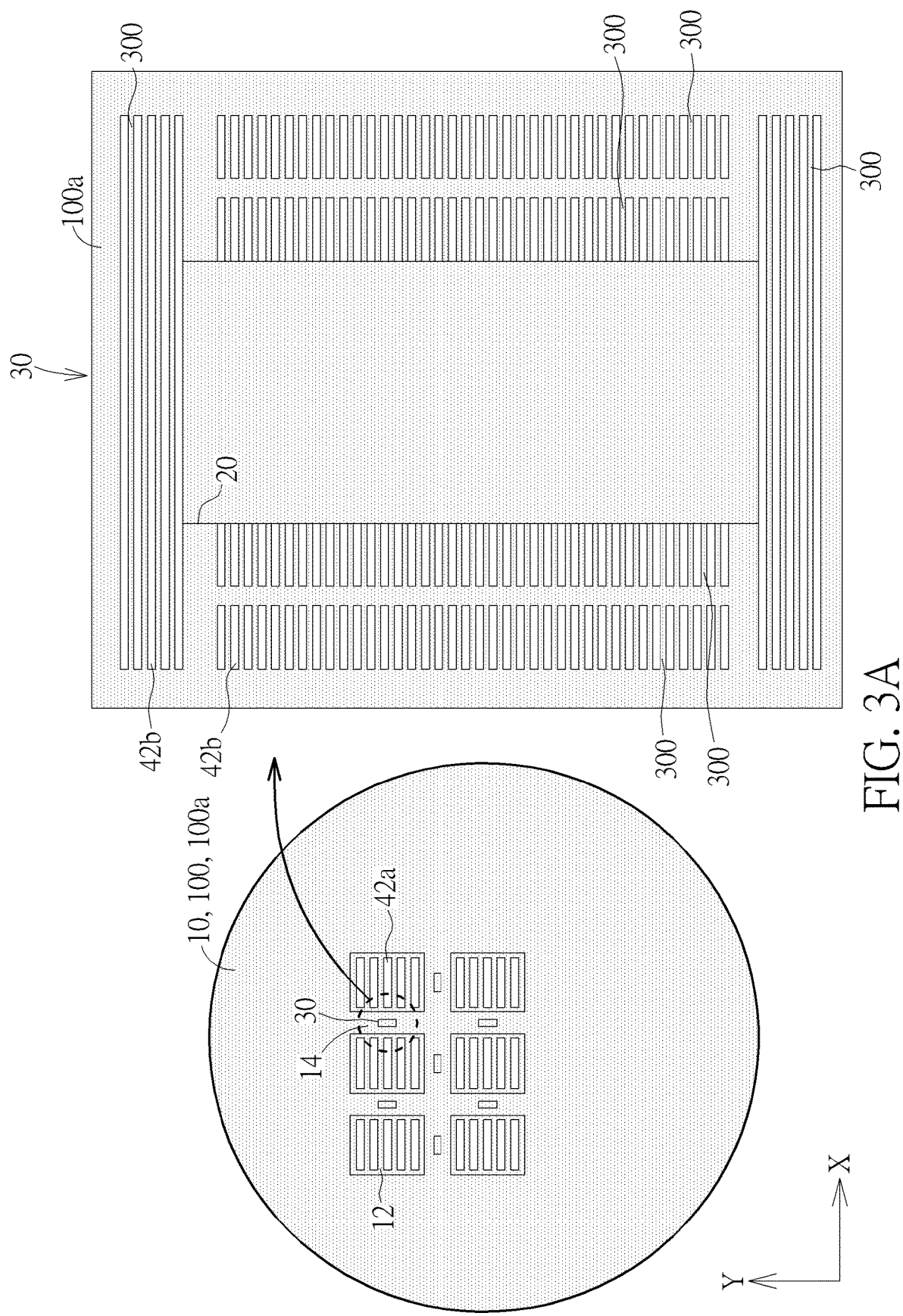
FIG. 3A, FIG. 3B and FIG. 3C are schematic diagrams illustrating a process of manufacturing the semiconductor structure on a substrate according to another embodiment of the present invention.
Figure 3B:
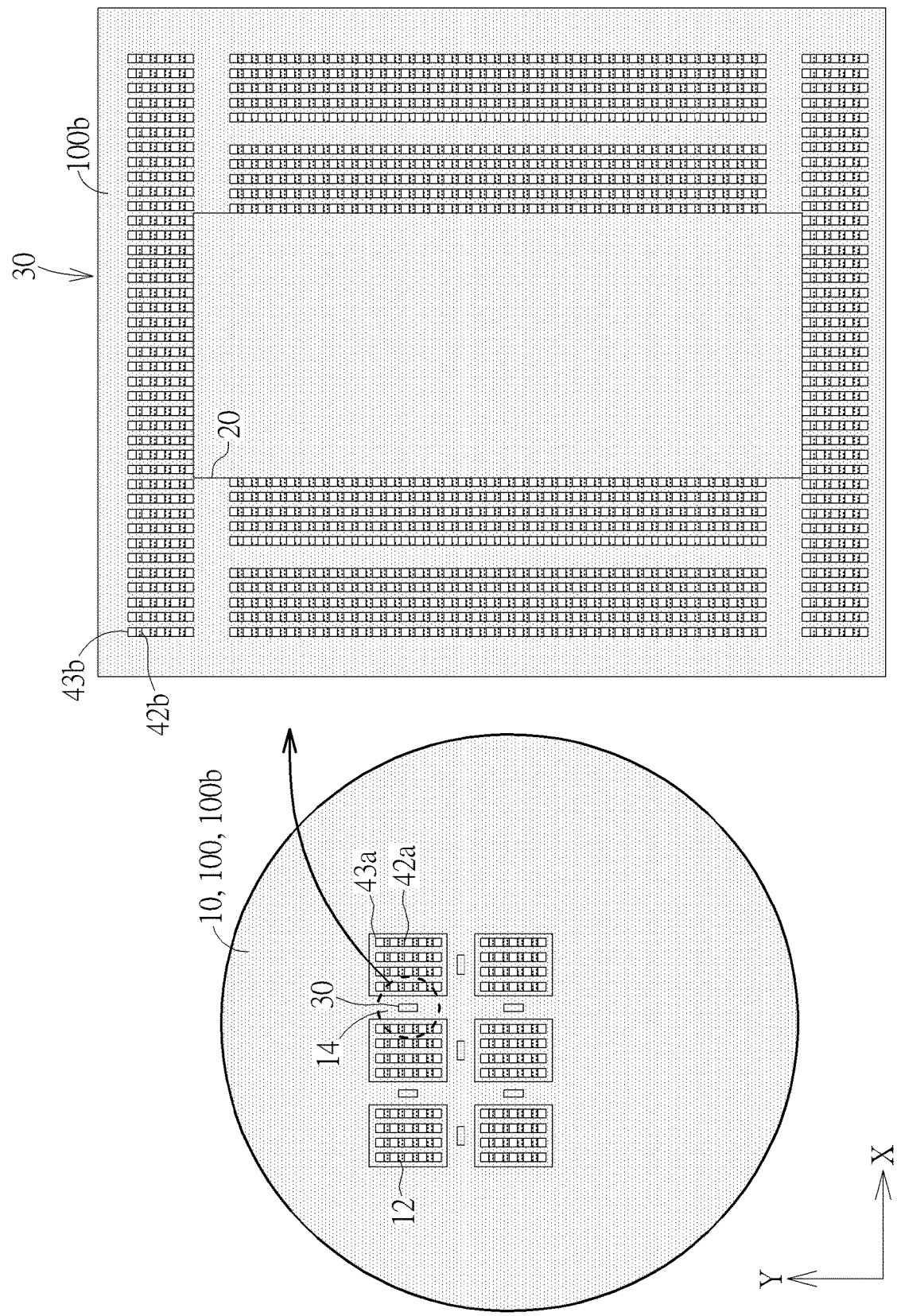
Figure 3C:
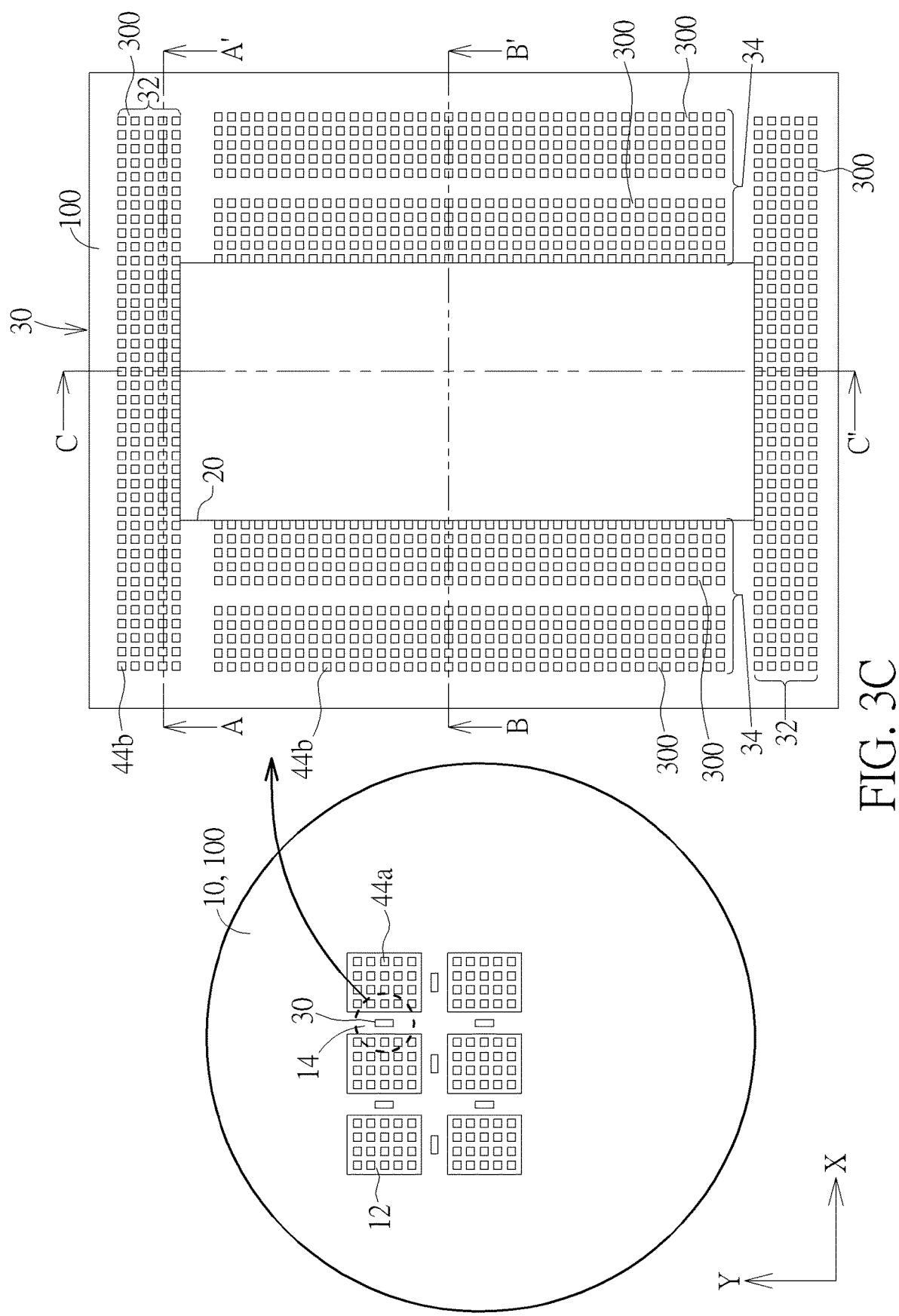

FIG. 3A, FIG. 3B and FIG. 3C are schematic top-view diagrams illustrating the process of manufacturing the semiconductor structure according to an embodiment of the present invention. As previously illustrated, the semiconductor structure 30 is formed in the material layer 100 on the scribe line region 14 of the substrate 10 and has a pair of first alignment features 32, each comprising a feature pattern 300 and being arranged along the two shorter edges of the rectangular region 20 and a pair of second alignment features 34, each comprising two feature patterns 300 and being arranged along the longer edges of the rectangular region 20 in the scribe line region 14. In the following illustrated embodiment, each of the feature patterns 300 of the semiconductor structure 30 may be an array pattern of a plurality of openings 44b. The openings 44b may be formed in the material layer 100 on the scribe line region 14 at the same time when forming the openings 44a (for forming the crown-type capacitors) in the material layer 100 on the chip region 12. According to an embodiment, as will be illustrated underneath, the process of forming the openings 44a and openings 44b may be a double patterning process.

Please refer to FIG. 3A. A substrate 10 is provided. The substrate 10 may be a silicon wafer used for forming DRAM devices. The substrate 10 may include a plurality of chip regions 12 arranged into an array of columns along the Y direction and rows along the X direction. The chip regions 12 are separated from each other by the scribe line regions 14 extending along the X direction or Y direction. The chip regions 12 may already have transistors, word-lines, bit-lines and interconnecting structures such as contact plugs formed therein that are not shown in the diagram for the sake of simplicity. A material layer 100 is formed on the substrate 100 in a blanket manner and completely covering the chip regions 12 and the scribe line regions 14. An optional hard mask layer (not shown) may be formed on the material layer 100, and a first photoresist layer 100a is formed on the hard mask layer in a blanket manner. A first patterning process is then performed to pattern the first photoresist layer 100a on the chip regions 12, forming a plurality of trench patterns 42a to expose a portion of the hard mask layer on the chip regions 12. The first photoresist layer 100a on the scribe line regions 14 is also patterned to form a plurality of trench patterns 42b arranged around a pre-determined rectangular region 20 and exposing a portion of the hard mask layer on the scribe line region 14. The trench patterns 42a and trench patterns 42b extend along the same direction. According to an embodiment, the trench patterns 42a and trench patterns 42b are extending along the X direction.

Please refer to FIG. 3B. Subsequently, a second photoresist layer 100b is formed on the substrate 10 in a blanket manner and completely covering the patterned first photoresist layer 100a. A second patterning process is then performed to pattern the second photoresist layer 100b on the chip regions 12 to form a plurality of trench patterns 43a to expose a portion of the patterned first photoresist layer 100a and a portion of the hard mask layer on the chip regions 12. The second photoresist layer 100b on the scribe line region 14 is also patterned to form a plurality of trench patterns 43b arranged around the rectangular region 20 and exposing a portion of the patterned first photoresist layer 100a and the hard mask layer on the scribe line region 14. The trench patterns 43a and trench patterns 43b extend along a direction perpendicular to the extending direction of the trench patterns 42a and trench patterns 42b. According to an embodiment, the trench patterns 43a and trench patterns 43b are extending along the Y direction. The overlaying of the trench patterns 43a on the trench pattern 42a and the overlaying of the trench pattern 43b on the trench pattern 42b respectively form an array of openings exposing a portion of the hard mask layer.

Please refer to FIG. 3C. Afterward, using the patterned first photoresist layer 100a and second photoresist layer 100b as the etching mask, the exposed portion of the hard mask layer is etched away, thereby forming a plurality of openings 44a in the material layer 100 on the array regions 12 and a plurality of openings 44b in the material layer 100 and arranged around the rectangular region 20. After etching the material layer 100, the remaining hard mask layer may be removed. The openings 44a and the openings 44b penetrate through the whole thickness of the material layer 100. The dimensions of the openings 44a are determined by the widths of the trench 42a and trench 43a. The dimensions of the openings 44b are determined by the widths of the trench 42b and trench 43b. According to an embodiment, the dimensions of the openings 44a and the openings 44b are the same. The openings 44a in the chip regions 12 may be used for forming the crown-type capacitors of the DRAM devices. The openings 44b in the scribe line region 14 are arrayed to form the feature patterns 300 each having a bar-shaped top view and are arranged into a pair of first alignment features 32 on two sides of the rectangular region 20 and a pair of second alignment features 34 on the other two sides of the rectangular region 20. The first alignment features 32 and the second alignment features 34 collectively form a semiconductor structure 30 that may be used as an alignment mark for evaluating the process alignment accuracy of the subsequent process of forming the crown-type capacitors of the DRAM devices. It is one feature of the present invention that by using the openings 44b having a dimension similar to that of the openings 44a in the chip regions 12 to construct the alignment mark, the under-etching and deformation problem resulted from the etching loading effect between the chip regions 12 and the scribe line region 12 may be prevented.

Figure 4:
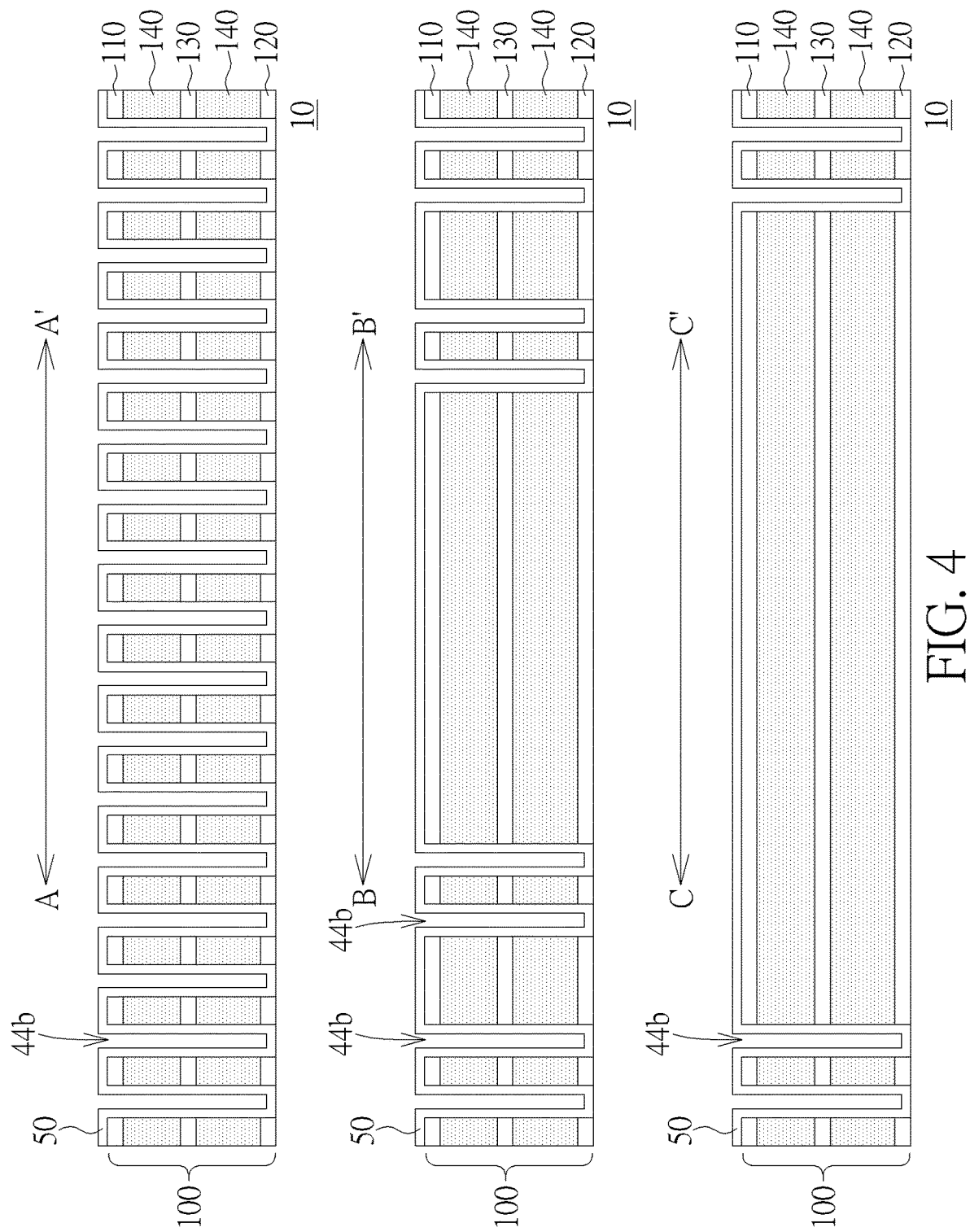
FIG. 4, FIG. 5, FIG. 6, FIG. 7A and FIG. 7B, FIG. 8, FIG. 9 and FIG. 10 are schematic diagrams illustrating a process of forming the semiconductor structure on a substrate according to still another embodiment of the present invention.
Figure 5:
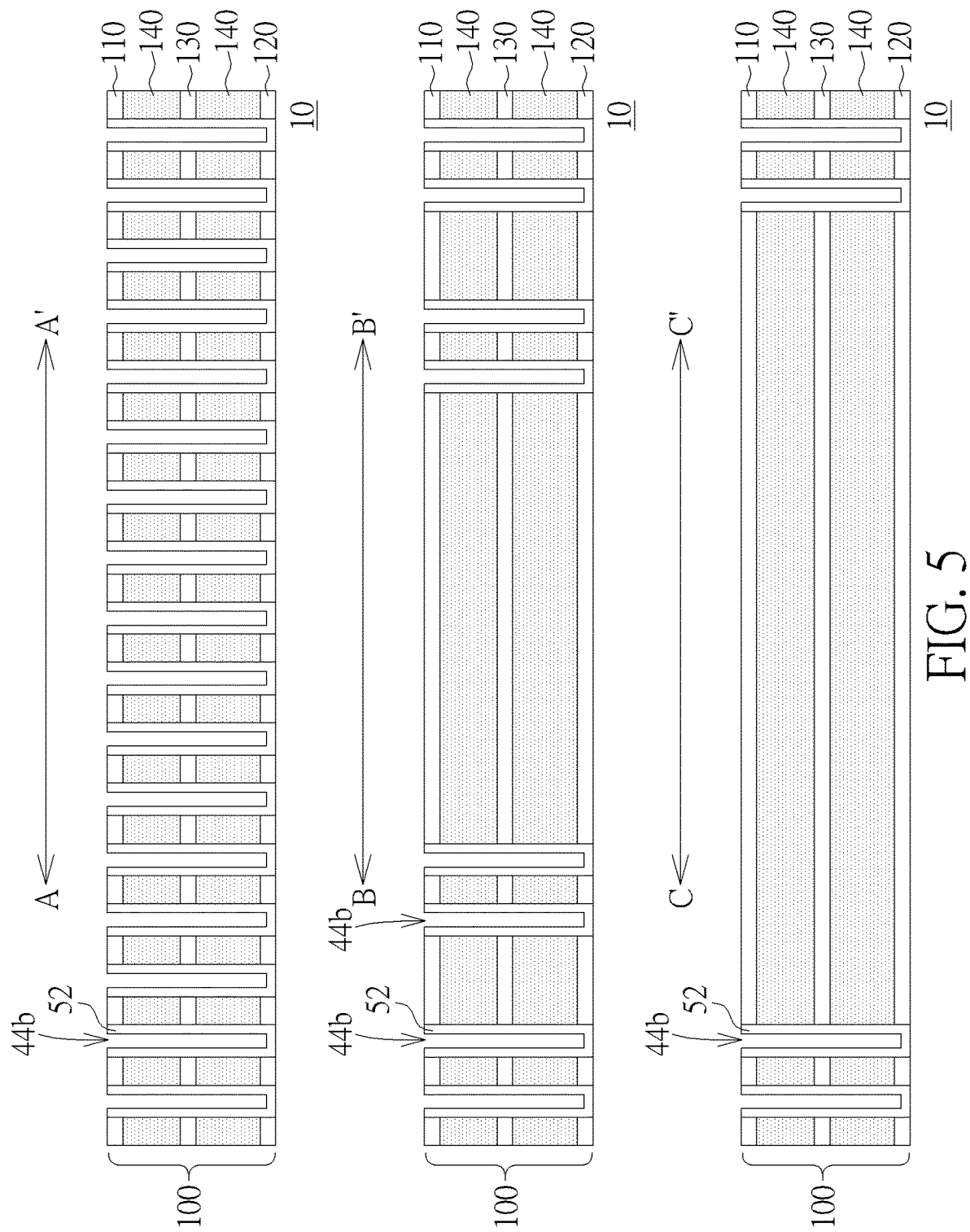
Figure 6:
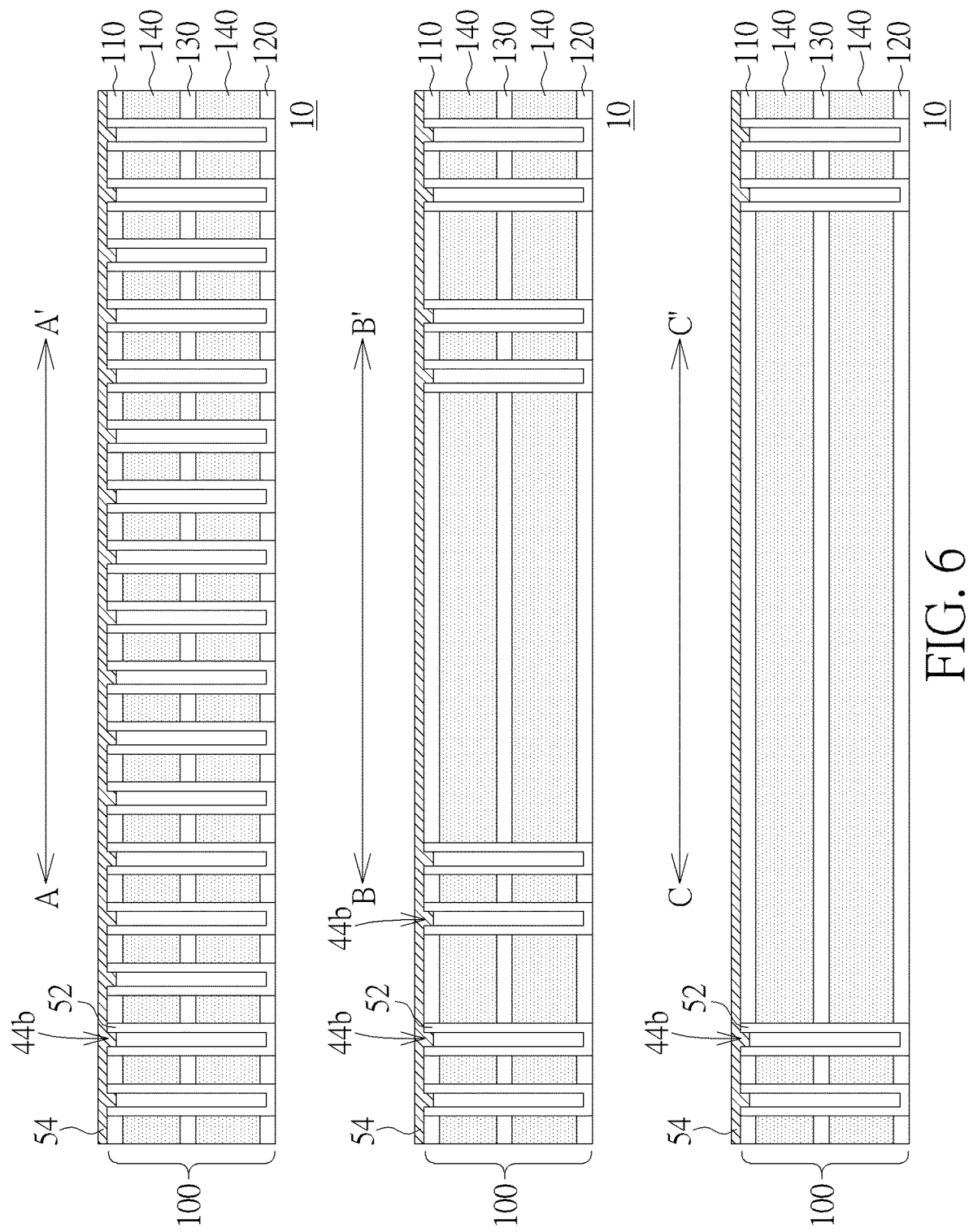
Figure 7A:
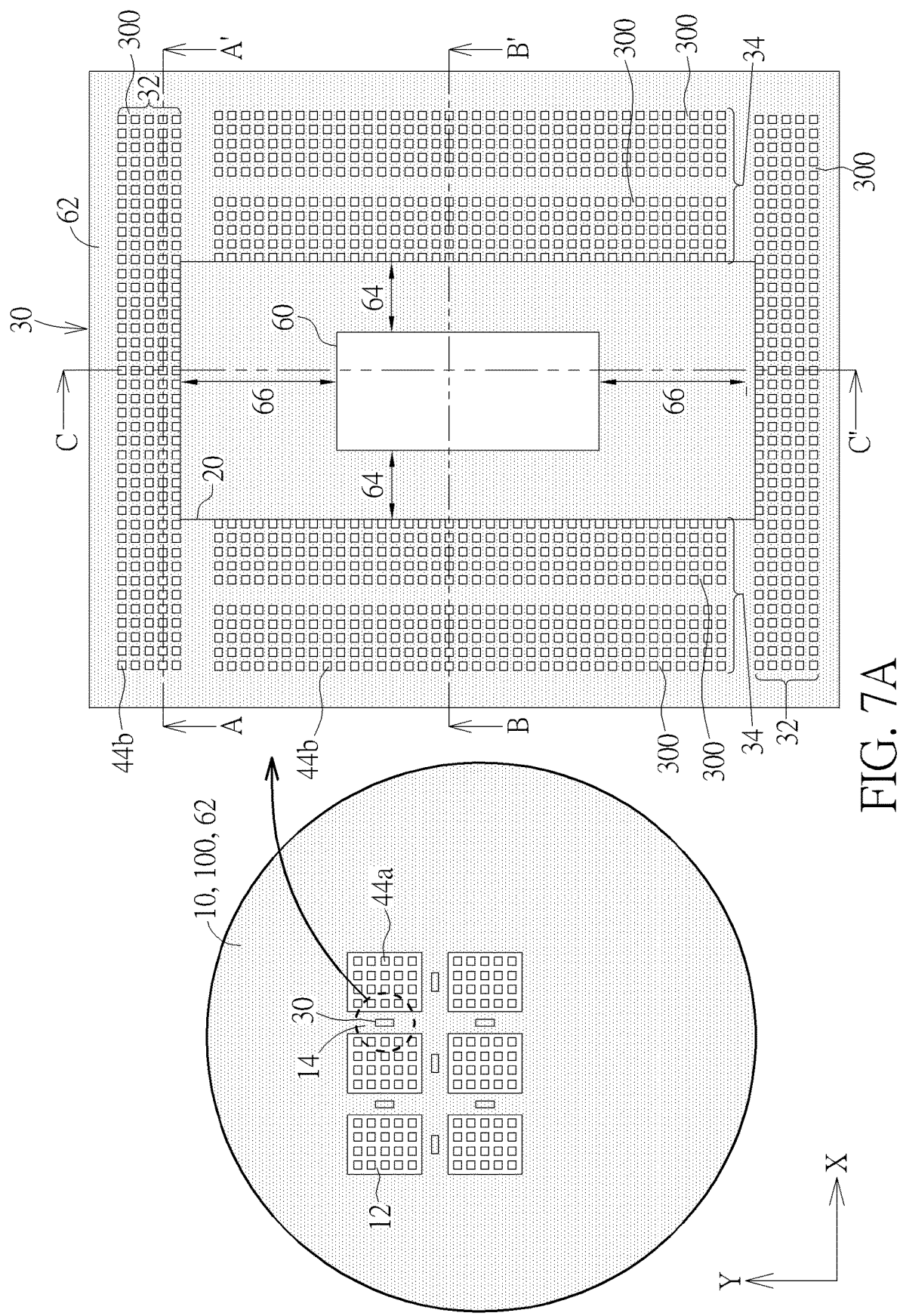
Figure 7B:
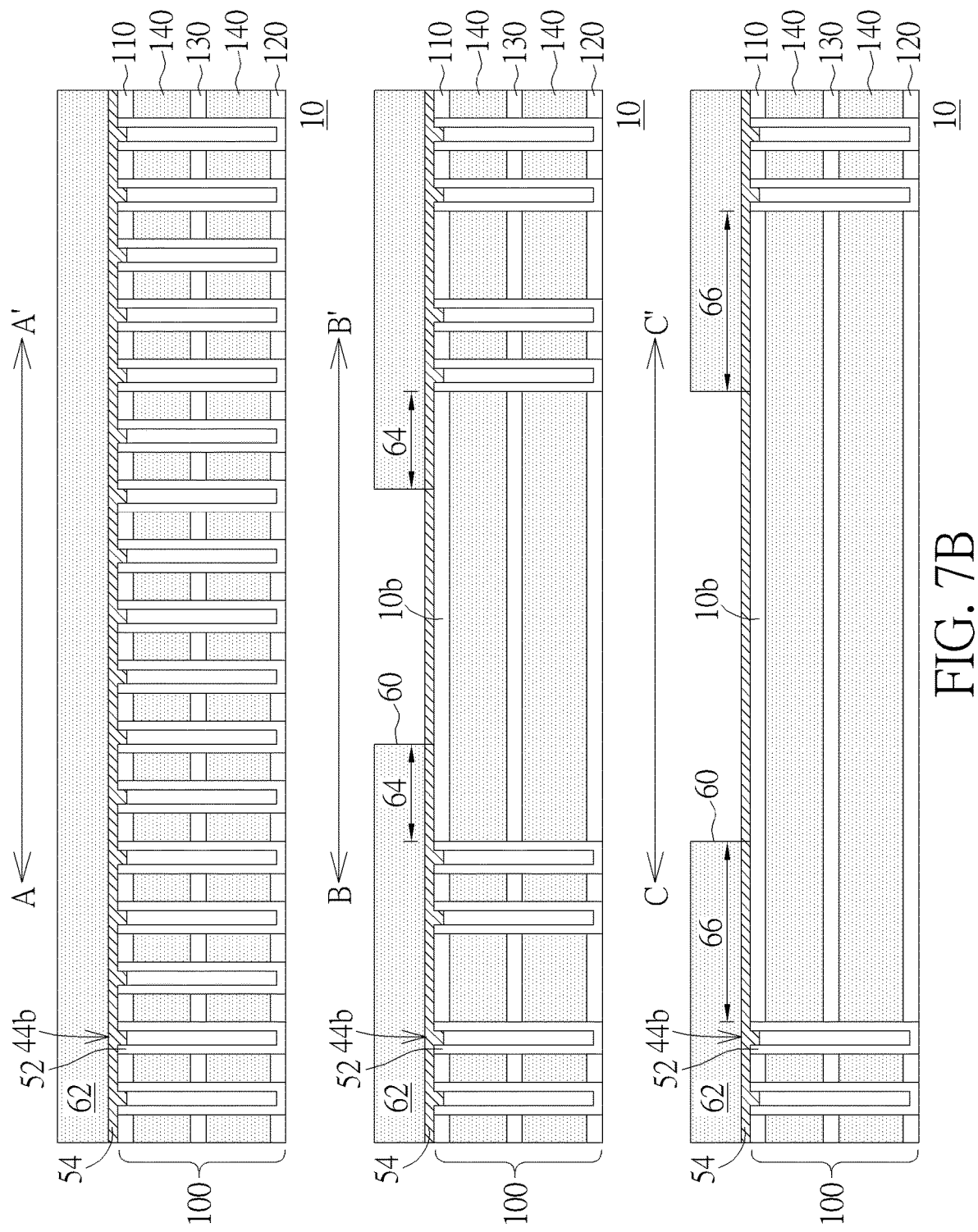
Figure 8:
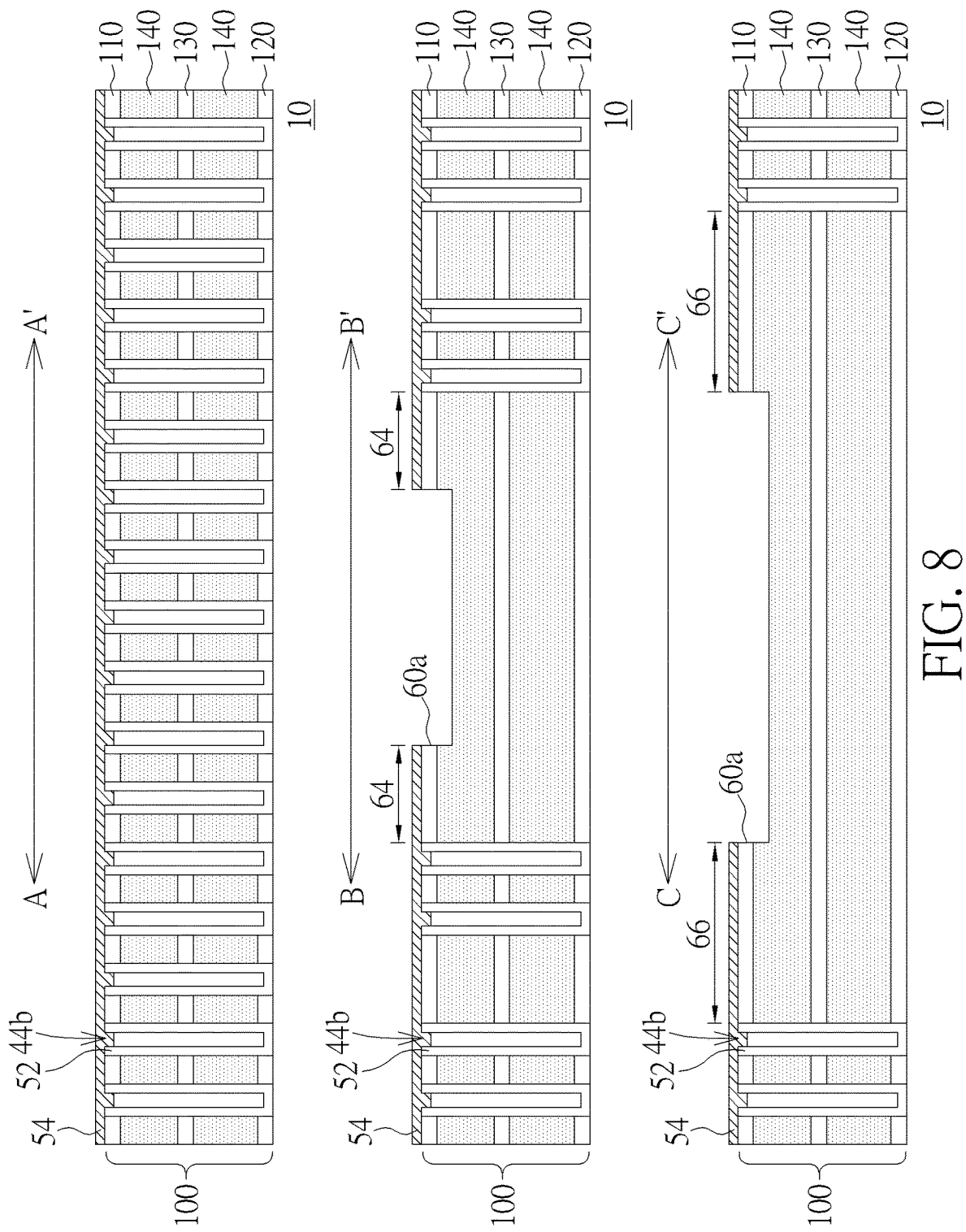
Figure 9:
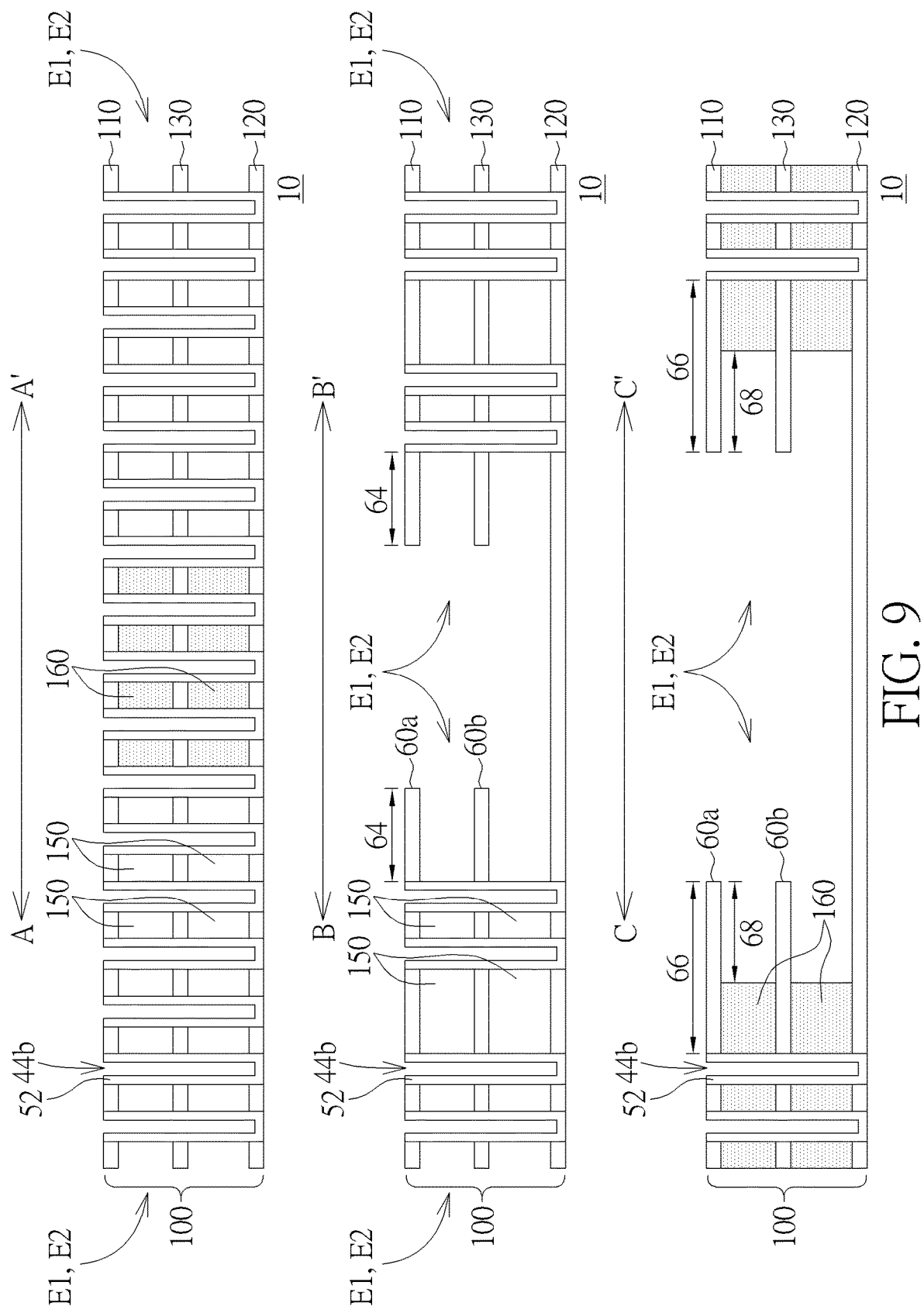

FIG. 4, FIG. 5, FIG. 6, FIG. 7A and FIG. 7B, FIG. 8, FIG. 9 and FIG. 10 are schematic diagrams illustrating a process of forming the semiconductor structure according to one embodiment of the present invention. FIG. 4 and FIG. 5 and FIG. 6 are cross-sectional views taken along line A-A', line B-B' and line C-C' as shown in the right portion of FIG. 3C. FIG. 7B and FIG. 8 are cross-section views taken along line A-A' and line B-B' and line C-C' as shown in the right portion of FIG. 7A. FIG. 9 shows cross-section views taken along line A-A' and line B-B' and line C-C' as shown in the right portion of FIG. 10.

As previously illustrated, the semiconductor structure 30 is formed in the material layer 100 on the scribe line region 14 of the substrate 10 and has a pair of first alignment features 32 arranged along the two shorter edges of an rectangular region 20 and a pair of second alignment features 34 arranged along the two longer edges of the rectangular region 20. Each of the first alignment features 32 and the second alignment features 34 comprises at least a feature pattern 300 comprising a plurality of arrayed openings 44b that are made by the same process of forming the openings 44a in the array regions 12. In the following illustrated embodiment, the semiconductor structure 30 as shown in FIG. 3C may be further processed by the process of forming the crown-type capacitors of the DRAM devices. It should be understood that the cross-sectional views of the chip region 12 may refer to the cross-sectional view taken along line B-B'.

Please refer to FIG. 4 and also refer to FIG. 3C for the top views. After forming the openings 44b in the scribe line region 14, a conductive layer 50 may be formed on the substrate 10 and conformally covering the material layer 100. The conductive layer 50 may fill into the openings 44b and conformally cover the sidewalls and bottoms of the openings 44b. According to an embodiment, the conductive layer 50 may comprise titanium nitride (TiN), but not limited thereto. The material layer 100 may be a multi-layered structure. According to an embodiment, as shown in FIG. 4, the material layer 100 may include, from bottom to top, a bottom supporting layer 120, a sacrificial layer 140 and a top supporting layer 110. The material layer 100 may include a middle supporting layer 130 between the top supporting layer 110 and the bottom supporting layer 120 and separated apart from the top supporting layer 110 and the bottom supporting layer 120 by the sacrificial layer 140. According to an embodiment, the top supporting layer 110, the middle supporting layer 130 and the bottom supporting layer 120 may comprise silicon carbon nitride (SiCN) or silicon nitride (SiN), but not limited thereto. The sacrificial layer 140 may comprise silicon oxide ($SiO_2$) or boron-phosphate-doped silicon glass (BPSG), but not limited thereto. As shown in FIG. 4, the openings 44b penetrate through the whole thickness of the material layer 100.

Please refer to FIG. 5. Afterward, the conductive layer 50 outside the openings 44b may be removed and the conductive layer 52 remaining inside the openings 44b may become a plurality of separated hollow-pillar structures that are respectively conformal to the shape of the openings 44b. Each of the hollow-pillar structures of the conductive layer 52 has a U-shaped cross-sectional profile, penetrating through the material layer 100 and is surrounded by the material layer 100.

Please refer to FIG. 6. Afterward, a dielectric layer 54 is formed on the material layer 100 in a blanket manner. The dielectric layer 54 seals the openings 44b to provide a flat upper surface favorable for the subsequent processes. According to an embodiment, the dielectric layer 54 may be deposited on the material layer 100 at a deposition rate fast enough to seal the opening 44b sooner to minimize the amount of the dielectric layer 54 being filled into the openings 44b. According to an embodiment, the dielectric layer 54 may comprise silicon oxide and formed by a chemical vapor deposition (CVD) process or a plasma-enhanced chemical vapor deposition (PECVD) process utilizing tetra-ethyl-ortho-silicate (TEOS) as a precursor.

Please refer to FIG. 7A, FIG. 7B and FIG. 8, which illustrate the process of performing a photolithography-etching process to form an opening 60a in the first top supporting layer 110 and expose a portion of the sacrificial layer 140 between the top supporting layer 110 and the middle supporting layer 130. FIG. 7B are cross-sectional views taken along line A-A', line B-B' and line C-C' shown I FIG. 7A.

Please refer to FIG. 7A, FIG. 7B and FIG. 8. After forming the dielectric layer 54, a mask layer 62 may be formed on the substrate 10 in a blanket manner. The mask layer 62 may be single-layered or multi-layered comprising (from bottom to top) an advanced patterning film (APF), an anti-reflection layer and a photoresist layer. Subsequently, a photolithography-etching process may be performed to form openings in predetermined regions of the mask layer 62 and exposing a portion of the dielectric layer 54 in the chip regions 12. As shown in FIG. 7A and FIG. 7B, a pre-determined region of the mask layer 62 over the semiconductor structure 30 in the scribe line region 14 may be removed to form an opening 60 that is substantially within the rectangular region 20 of the semiconductor structure 30. The alignment accuracy of the aforesaid photolithography-etching process may be determined by measuring the distances 66 and 64 between edges of the opening 60 and the edges of the first alignment features 32 and the second alignment features 34, respectively. For example, when the aforesaid photolithography-etching process is precisely aligned with previous patterns on the substrate 10, the two distances 66 respectively measured form the two edges of the opening 60 to the pair of first alignment features 32 may substantially equal to each other, the two distance 64 respectively measured from the other two edges of the opening 60 to the second alignment feature 34 may substantially equal to each other, and the four edges of the opening 60 may be parallel with the four edges of the rectangular region 20, respectively.

Please refer to FIG. 8. Afterward, using the mask layer 62 as an etching mask, the dielectric layer 54 and the top supporting layer 110 are etched to form openings that expose the sacrificial layer 140 for being removed in later processes. According to the embodiment, the dielectric layer 54 and the top supporting layer 110 exposed from the opening 60 are also removed and an opening 60a is formed in the top supporting layer 110 and exposing a portion of the sacrificial layer 140. The remaining mask layer 62 may be removed.

Figure 10:
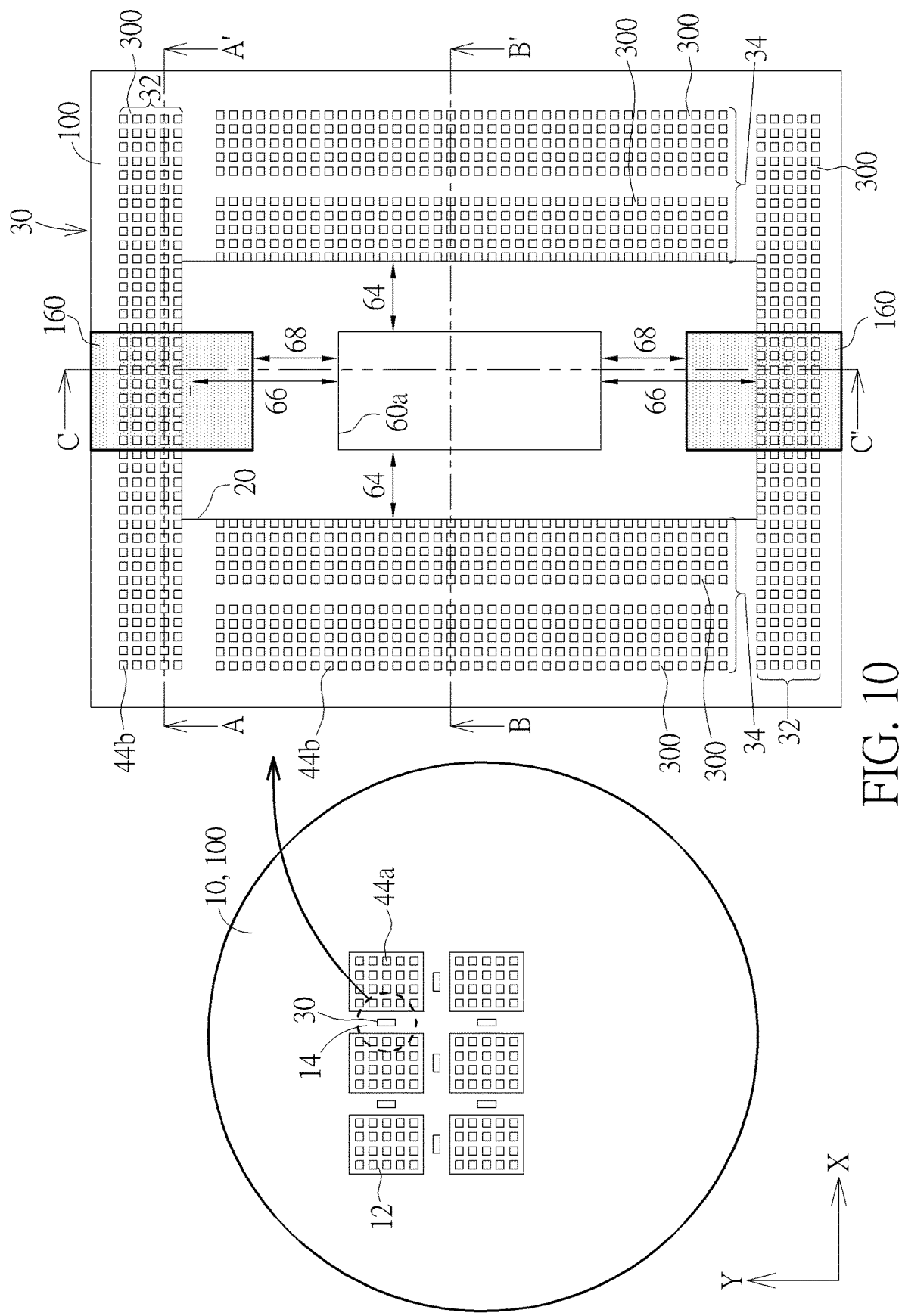

Please refer to FIG. 9 and FIG. 10, which illustrate the process of removing the sacrificial layer 140 from the openings of the top supporting layer 110 by performing a series of removal processes. As shown in FIG. 9 and FIG. 10, a first removal process E1 is performed to remove the sacrificial layer 140 from the opening 60a. According to an embodiment, the first removal process E1 may be a wet etching process. The sacrificial layer 140 between the top supporting layer 110 and the middle supporting layer 130 are etched downwardly and laterally from the opening 60a until a portion of the middle supporting layer 130 is exposed. Afterward, the exposed middle supporting layer 130 is removed to form an opening 60b exposing a portion of the sacrificial layer 140 between the middle supporting layer 130 and the bottom supporting layer 120. After that, a second removal process E2 is performed to continue the removal of the sacrificial layer 140. According to an embodiment, the second removal process E2 may be a wet etching process. During the second removal process E2, the sacrificial layer 140 between the middle supporting layer 130 and the bottom supporting layer 120 are etched downwardly and laterally from the opening 60b, and the sacrificial layer 140 between the top supporting layer 110 and the middle supporting layer 130 is further etched until a predetermined lateral removal distance 68 is achieved. The lateral removal distance 68 is the overall removed distance of the sacrificial layer 140 from the edges of the opening 60a to the sidewall of the remaining sacrificial layer 140. Preferably, the sacrificial layer 140 around the hollow-pillar structures of the conductive layer 52 in the chip regions 12 are completely removed (such as the cross-sectional view taken alone line B-B'). According to an embodiment, the dielectric layer 54 is also removed by the first removal process E1.

According to an embodiment, the portions of the top supporting layer 110 adjacent to the outer edges of the second alignment features 34 of the semiconductor structure 30 may also be removed when forming the opening 60a. Consequently, as shown in FIG. 9's cross-sectional views taken along line A-A' and line B-B', the first removal process E1 and the second removal process E2 may remove the sacrificial layer 140 from the distal ends of the first alignment features 32 and from the outer edges of the second alignment features 34 of the semiconductor structure 30.

After the first removal process E1 and the second removal process E2, spaces 150 are formed in the material layer 100 by removing the sacrificial layer 140. The spaces 150 are sandwiched between the top supporting layer 110, the middle supporting layer 130 and the bottom supporting layer 120. The remaining sacrificial layer 140 becomes a third alignment feature 160 of the semiconductor structure 30. As shown in the right portion of FIG. 10, the third alignment feature 160 partially overlap the first alignment features 32 and do not overlap the second alignment features 34. That is, the sacrificial layer 140 surrounding the hollow-pillar structures of conductive layer 52 of the second alignment features 34 is completely removed and the outer surfaces of the hollow-pillar structures of the conductive layer 52 of the second alignment features 34 are therefore exposed. According to an embodiment, the sacrificial layer 140 in the chip regions 12 is also removed from openings in the top supporting layer 110 in the chip regions 12 by the first removal process E1 and the second removal process E2 to expose the outer surfaces of the hollow-pillar structures of the conductive layer 52 in the chip region 12.

It is noteworthy that the lateral removal distance 68 and the dimension of the opening 60a of the top supporting layer 110 are dependent. That is, the dimension of the opening 60 of the patterned mask layer 62 may be adjusted according to the lateral removal distance 68 to make sure that the remaining sacrificial layer 140 (the third alignment feature 160) may partially overlap the first alignment features 32 after the first removal process E1 and the second removal process E2. According to an embodiment, as shown in FIG. 10, the distances 66 from the edges of the opening 60 to the inner edges of the first alignment features 32 may be larger than the lateral removal distance 68. The distances 64 from the edges of the opening 60 to the inner edges of the second alignment features 34 may be smaller than the overall lateral removal distance 68. For example, the lateral removal distance 68 may be approximately 4 micrometers, the distances 66 may be larger than 4 micrometers, and the distance 64 may be smaller than 4 micrometers. Preferably, the distances 66 may be larger than 6 micrometers.

It is one feature of the present invention that by forming the hollow-pillar structures of conductive layer 52 penetrating the material layer 110 and having the remaining sacrificial layer 140 surrounding a portion of the hollow-pillar structures of conductive layer 52 in the second alignment feature 34, the three-dimensional staking structure of the top supporting layer 110, middle supporting layer 130 and bottom supporting layer 120 of the material layer 110 may be securely supported and the collapse may be prevented. After removing the sacrificial layer 140, following processes such as forming a capacitor dielectric layer and another conductive layer on the capacitor dielectric layer may be performed and would not be illustrated herein for the sake of simplicity.

Figure 11:
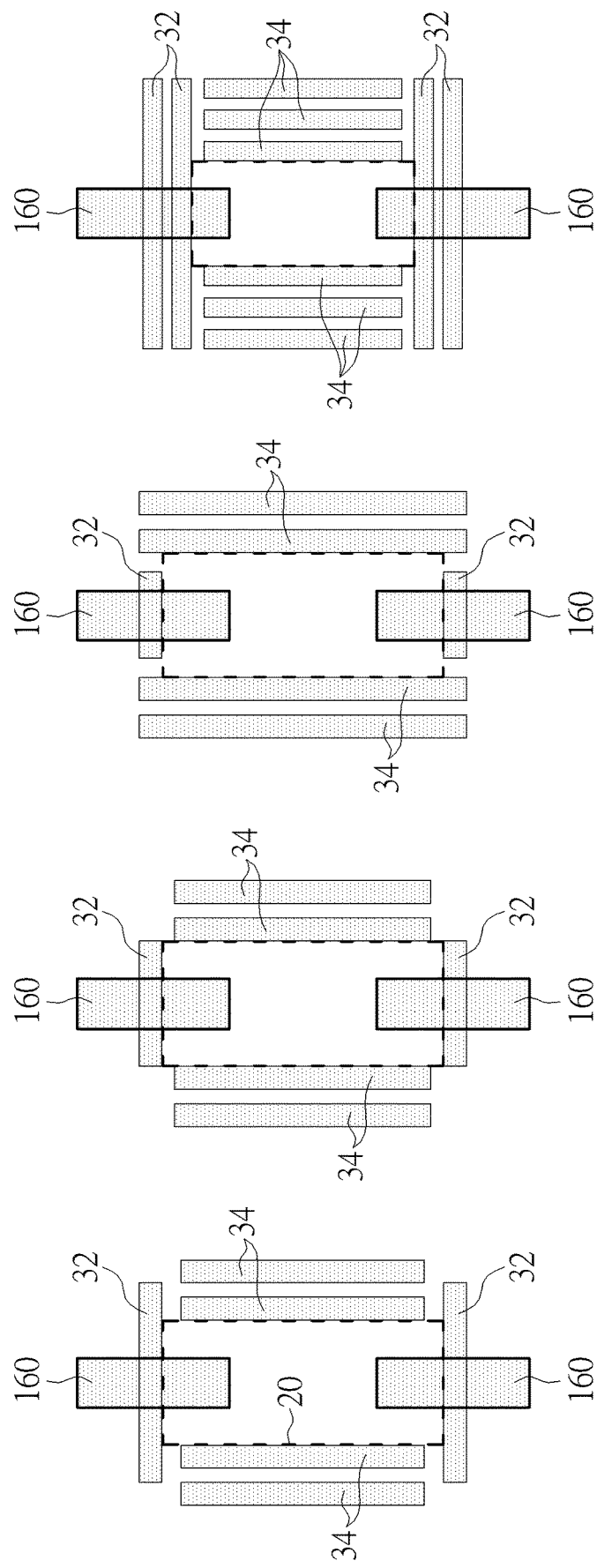
FIG. 11 is a schematic diagram illustrating top views of the semiconductor structures according to some modifications of the present invention.

FIG. 11 illustrates modifications of the semiconductor structure 30 according to some embodiments of the present invention. The difference between the semiconductor structures 30 shown in FIG. 11 and the semiconductor structure 30 previously shown in the right portion of FIG. 2 would be described below.

Please refer to diagram (a) of FIG. 11, the semiconductor structure 30 may have the first alignment features 32 having a length larger than length of the shorter edge 22 of the rectangular region 20 but smaller than the distance between the outer edges of the second alignment features 34. That is, the distal ends of the first alignment features 32 are not flush with the outer edges of the second alignment features 34, and the second alignment features 34 may not be completely within the region between the pair of the first alignment features 32. Please refer to diagram (b) of FIG. 11, the semiconductor structure may have the first alignment features 32 having a length substantially the same as the shorter edges of the rectangular region 20 and having two distal ends flush with the longer edges of the rectangular region 20. Please refer to diagram (c) of FIG. 11, the semiconductor structure 30 may have the first alignment features 32 having a length smaller than the shorter edges of the rectangular region 20 and the second alignment features 34 having a length larger than the longer edges of the rectangular region 20. The distal ends of the second alignment features 34 are flush with the outer edges of the first alignment features 32, and the first alignment features 32 may be completely within the region between the pair of second alignment features 34. Please refer to diagram (d) of FIG. 11, the semiconductor structure 30 may have the first alignment features 32 and second alignment features 34 each comprising plural feature patterns 300, and the second alignment features 34 may have more feature patterns 300 than the first alignment features 32. It is noteworthy that the first alignment features 32 in each modifications illustrated above are overlapped with the third alignment features 160, and the second alignment features 34 are not overlapped with the third alignment features 160.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor structure, comprising:
a substrate having a scribe line region;
a material layer formed on the scribe line region of the substrate and having a rectangular region defined therein, wherein the rectangular region comprises a pair of first edges parallel with a widthwise direction of the scribe line region and a pair of second edges parallel with a lengthwise direction of the scribe line region;
a pair of first alignment features formed in the material layer along the first edges; and
a pair of second alignment features formed in the material layer along the second edges, wherein a space between the pair of first alignment features is larger than a space between the pair of the second alignment features.

2. The semiconductor structure according to claim 1, wherein the first alignment features and the second alignment features form an alignment mark for evaluating the alignment accuracy of a photolithography process.

3. The semiconductor structure according to claim 1, wherein the second alignment features have a length smaller than the second edges of the rectangular region.

4. The semiconductor structure according to claim 3, wherein the first alignment features have a length larger than the first edges of the rectangular region.

5. The semiconductor structure according to claim 4, wherein the first alignment features have distal ends flush with an edge of the second alignment features along the lengthwise direction of the scribe line region.

6. The semiconductor structure according to claim 4, wherein the first alignment features have distal ends not flush with an edge of the second alignment features along the lengthwise direction of the scribe line region.

7. The semiconductor structure according to claim 3, wherein the first alignment features have a length substantially equal to the first edges.

8. The semiconductor structure according to claim 1, wherein the second alignment features have a length larger than the second edges, the first alignment features have a length smaller than the first edges.

9. The semiconductor structure according to claim 1, wherein the first alignment features have a width different from that of the second alignment features.

10. The semiconductor structure according to claim 1, wherein each of the first alignment features and each of the second alignment features comprise at least a feature pattern that has a bar-shaped top view.

11. The semiconductor structure according to claim 10, wherein each of the first alignment features comprises one of the feature pattern, and each of the second alignment features comprises at least two of the feature patterns arranged in parallel.

12. The semiconductor structure according to claim 10, wherein each of the first alignment features and each of the second alignment features comprise at least two of the feature patterns, and the number of the feature patterns of the second alignment features is larger than that of the first alignment features.

13. The semiconductor structure according to claim 10, wherein the feature pattern is an array pattern made of a plurality of openings.

14. The semiconductor structure according to claim 13, wherein the openings penetrate through the whole thickness of the material layer, a plurality of hollow-pillar structures are conformally formed in the openings.

15. The semiconductor structure according to claim 14, wherein the material layer comprises a top supporting layer, a bottom supporting layer and a sacrificial dielectric layer sandwiched between the top supporting layer and the bottom supporting layer.

16. The semiconductor structure according to claim 15, wherein the sacrificial layer partially fills the space between the top supporting layer and the bottom supporting layer and form a third alignment feature, the spaces between the top supporting layer and the bottom supporting layer not filled by the sacrificial layer is a gap.

17. The semiconductor structure according to claim 16, wherein the third alignment feature overlaps the first alignment features, the third alignment feature does not overlap the second alignment features from the top view.

18. The semiconductor structure according to claim 16, wherein the hollow-pillar structures in the middle portion of the first alignment features are surrounded by the sacrificial layer, the hollow-pillar structures in the two ends of the first alignment features are surrounded by the gap.

19. The semiconductor structure according to claim 16, wherein all of the hollow-pillar structures of the second alignment features are surrounded by the gap.

* * * * *